(12) United States Patent
Lee et al.

(10) Patent No.: US 10,906,802 B2
(45) Date of Patent: Feb. 2, 2021

(54) ACTUATOR LAYER PATTERNING WITH TOPOGRAPHY

(71) Applicant: InvenSense, Inc., San Jose, CA (US)

(72) Inventors: Daesung Lee, San Jose, CA (US); Dongyang Kang, San Jose, CA (US); Chienlu Chang, Los Altos, CA (US); Bongsang Kim, Mountain View, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/440,816

(22) Filed: Jun. 13, 2019

(65) Prior Publication Data

US 2020/0131033 A1    Apr. 30, 2020

Related U.S. Application Data

(60) Provisional application No. 62/752,948, filed on Oct. 30, 2018.

(51) Int. Cl.
*B81C 1/00* (2006.01)
*B81B 7/02* (2006.01)
*B81C 3/00* (2006.01)

(52) U.S. Cl.
CPC ........... *B81C 1/00492* (2013.01); *B81B 7/02* (2013.01); *B81C 1/00269* (2013.01); *B81C 1/00333* (2013.01); *B81C 1/00388* (2013.01); *B81C 1/00396* (2013.01); *B81C 1/00428* (2013.01); *B81C 1/00523* (2013.01); *B81C 1/00547* (2013.01); *B81C 3/001* (2013.01); *B81B 2201/03* (2013.01); *B81C 2201/0104* (2013.01); *B81C 2201/0126* (2013.01); *B81C 2201/0197* (2013.01); *B81C 2203/0118* (2013.01); *B81C 2203/03* (2013.01); *B81C 2203/036* (2013.01)

(58) Field of Classification Search
CPC ............ B81C 1/00238; B81C 1/00269; B81C 2203/0792; B81C 2203/036; H01L 2924/00; H01L 41/1132; H01L 41/0825
See application file for complete search history.

(56) References Cited

U.S. PATENT DOCUMENTS

| | | | |
|---|---|---|---|
| 9,216,897 B2 * | 12/2015 | Chan | ................. B81B 3/0021 |
| 9,511,994 B2 * | 12/2016 | Tsai | ................. B81C 1/00182 |
| 2005/0170656 A1 | 8/2005 | Nasiri | |
| 2012/0094435 A1 | 4/2012 | Nasiri | |
| 2014/0077316 A1 | 3/2014 | Sparks | |

(Continued)

*Primary Examiner* — Jaehwan Oh

(57) ABSTRACT

Provided herein is a method including fusion bonding a handle wafer to a first side of a device wafer. Standoffs are formed on a second side of the device wafer. A first hardmask is deposited on the second side. A second hardmask is deposited on the first hardmask. A surface of the second hardmask is planarized. A photoresist is deposited on the second hardmask, wherein the photoresist includes a MEMS device pattern. The MEMS device pattern is etched into the second hardmask. The MEMS device pattern is etched into the first hardmask, wherein the etching stops before reaching the device wafer. The photoresist and the second hardmask are removed. The MEMS device pattern is further etched into the first hardmask, wherein the further etching reaches the device wafer. The MEMS device pattern is etched into the device wafer. The first hardmask is removed.

20 Claims, 14 Drawing Sheets

(56) References Cited

U.S. PATENT DOCUMENTS

2017/0355593 A1* 12/2017 Huang .................... B81B 7/007
2018/0016135 A1*  1/2018 Lee ..................... B81C 1/00238
2018/0370790 A1   12/2018 Cheng

* cited by examiner

1900

```
┌─────────────────────────────────────────────────────────────┐
│ A HANDLE WAFER IS FUSION BONDED TO A FIRST SIDE OF A DEVICE │
│                            WAFER                             │
│                            1902                              │
└─────────────────────────────────────────────────────────────┘
                              │
┌─────────────────────────────────────────────────────────────┐
│   STANDOFFS ARE FORMED ON A SECOND SIDE OF THE DEVICE WAFER  │
│                            1904                              │
└─────────────────────────────────────────────────────────────┘
                              │
┌─────────────────────────────────────────────────────────────┐
│        A FIRST HARDMASK IS DEPOSITED ON THE SECOND SIDE      │
│                            1906                              │
└─────────────────────────────────────────────────────────────┘
                              │
┌─────────────────────────────────────────────────────────────┐
│       A SECOND HARDMASK IS DEPOSITED ON THE FIRST HARDMASK   │
│                            1908                              │
└─────────────────────────────────────────────────────────────┘
                              │
┌─────────────────────────────────────────────────────────────┐
│          A SURFACE OF THE SECOND HARDMASK IS PLANARIZED      │
│                            1910                              │
└─────────────────────────────────────────────────────────────┘
                              │
┌─────────────────────────────────────────────────────────────┐
│ A PHOTORESIST IS DEPOSITED ON THE SECOND HARDMASK, WHEREIN   │
│    THE PHOTORESIST INCLUDES A MEMS DEVICE PATTERN            │
│                            1912                              │
└─────────────────────────────────────────────────────────────┘
                              │
┌─────────────────────────────────────────────────────────────┐
│     THE MEMS DEVICE PATTERN IS ETCHED INTO THE SECOND HARDMASK│
│                            1914                              │
└─────────────────────────────────────────────────────────────┘
                              │
┌─────────────────────────────────────────────────────────────┐
│   THE MEMS DEVICE PATTERN IS ETCHED INTO THE FIRST HARDMASK, │
│   WHEREIN THE ETCHING STOPS BEFORE REACHING THE DEVICE WAFER │
│                            1916                              │
└─────────────────────────────────────────────────────────────┘
                              │
                    ( CONTINUED IN FIG 19B )
```

```
┌─────────────────────────────┐
│   CONTINUED FROM FIG 19A    │
└─────────────┬───────────────┘
              │
┌─────────────┴───────────────────────────────┐
│ THE PHOTORESIST AND THE SECOND HARDMASK ARE REMOVED │
│                   1918                              │
└─────────────┬───────────────────────────────┘
              │
┌─────────────┴───────────────────────────────────────┐
│ THE MEMS DEVICE PATTERN IS FURTHER ETCHED INTO THE FIRST │
│ HARDMASK, WHEREIN THE FURTHER ETCHING REACHES THE DEVICE │
│                        WAFER                             │
│                        1920                              │
└─────────────┬───────────────────────────────────────┘
              │
┌─────────────┴───────────────────────────────┐
│ THE MEMS DEVICE PATTERN IS ETCHED INTO THE DEVICE WAFER │
│                      1922                              │
└─────────────┬───────────────────────────────┘
              │
┌─────────────┴───────────────────────────────┐
│      THE FIRST HARDMASK IS REMOVED           │
│                  1924                        │
└─────────────────────────────────────────────┘
```

```
┌─────────────────────────────────────────────────────────────┐
│ A HANDLE WAFER IS FUSION BONDED TO A FIRST SIDE OF A DEVICE │
│                          WAFER                              │
│                          2002                               │
└─────────────────────────────────────────────────────────────┘
                              │
┌─────────────────────────────────────────────────────────────┐
│  STANDOFFS ARE FORMED ON A SECOND SIDE OF THE DEVICE WAFER  │
│                          2004                               │
└─────────────────────────────────────────────────────────────┘
                              │
┌─────────────────────────────────────────────────────────────┐
│         A HARDMASK IS DEPOSITED ON THE SECOND SIDE          │
│                          2006                               │
└─────────────────────────────────────────────────────────────┘
                              │
┌─────────────────────────────────────────────────────────────┐
│            A SURFACE OF THE HARDMASK IS PLANARIZED          │
│                          2008                               │
└─────────────────────────────────────────────────────────────┘
                              │
┌─────────────────────────────────────────────────────────────┐
│ A PHOTORESIST IS DEPOSITED ON THE HARDMASK, WHEREIN THE     │
│       PHOTORESIST INCLUDES A MEMS DEVICE PATTERN            │
│                          2010                               │
└─────────────────────────────────────────────────────────────┘
                              │
┌─────────────────────────────────────────────────────────────┐
│       THE MEMS DEVICE PATTERN IS ETCHED INTO THE HARDMASK   │
│                          2012                               │
└─────────────────────────────────────────────────────────────┘
                              │
┌─────────────────────────────────────────────────────────────┐
│                  THE PHOTORESIST IS REMOVED                 │
│                          2014                               │
└─────────────────────────────────────────────────────────────┘
                              │
┌─────────────────────────────────────────────────────────────┐
│     THE MEMS DEVICE PATTERN IS ETCHED INTO THE DEVICE WAFER │
│                          2016                               │
└─────────────────────────────────────────────────────────────┘
                              │
┌─────────────────────────────────────────────────────────────┐
│                   THE HARDMASK IS REMOVED                   │
│                          2018                               │
└─────────────────────────────────────────────────────────────┘
```

```
┌─────────────────────────────────────────────────────────────────┐
│  A HANDLE WAFER IS FUSION BONDED TO A FIRST SIDE OF A DEVICE    │
│                            WAFER                                 │
│                            2102                                  │
└─────────────────────────────────────────────────────────────────┘
                                │
┌─────────────────────────────────────────────────────────────────┐
│   STANDOFFS ARE FORMED ON A SECOND SIDE OF THE DEVICE WAFER     │
│                            2104                                  │
└─────────────────────────────────────────────────────────────────┘
                                │
┌─────────────────────────────────────────────────────────────────┐
│        A FIRST HARDMASK IS DEPOSITED ON THE SECOND SIDE         │
│                            2106                                  │
└─────────────────────────────────────────────────────────────────┘
                                │
┌─────────────────────────────────────────────────────────────────┐
│       A SECOND HARDMASK IS DEPOSITED ON THE FIRST HARDMASK      │
│                            2108                                  │
└─────────────────────────────────────────────────────────────────┘
                                │
┌─────────────────────────────────────────────────────────────────┐
│            A SURFACE OF THE SECOND HARDMASK IS PLANARIZED        │
│                            2110                                  │
└─────────────────────────────────────────────────────────────────┘
                                │
┌─────────────────────────────────────────────────────────────────┐
│  A PHOTORESIST IS DEPOSITED ON THE SECOND HARDMASK, WHEREIN     │
│     THE PHOTORESIST INCLUDES A MEMS DEVICE PATTERN              │
│                            2112                                  │
└─────────────────────────────────────────────────────────────────┘
                                │
┌─────────────────────────────────────────────────────────────────┐
│     THE MEMS DEVICE PATTERN IS ETCHED INTO THE SECOND HARDMASK  │
│                            2114                                  │
└─────────────────────────────────────────────────────────────────┘
                                │
┌─────────────────────────────────────────────────────────────────┐
│ THE MEMS DEVICE PATTERN IS ETCHED INTO THE FIRST HARDMASK AND   │
│  PARTIALLY INTO THE DEVICE WAFER EXPOSING PORTIONS OF THE       │
│                        DEVICE WAFER                              │
│                            2116                                  │
└─────────────────────────────────────────────────────────────────┘
                                │
                    ( CONTINUED IN FIG 21B )
```

```
CONTINUED FROM FIG 21A
        │
        ▼
THE PHOTORESIST IS REMOVED
2118

THE MEMS DEVICE PATTERN IS FURTHER ETCHED INTO THE DEVICE
WAFER AND THE SECOND HARDMASK IS REMOVED
2120

THE FIRST HARDMASK IS REMOVED
2122
```

FIG. 21B

ND TOPOGRAPHY"

ACTUATOR LAYER PATTERNING WITH TOPOGRAPHY

CROSS-REFERENCE TO RELATED APPLICATIONS

This application claims the benefit of U.S. Provisional Patent Application Ser. No. 62/752,948 filed Oct. 30, 2018, entitled "ACTUATOR LAYER PATTERNING WITH TOPOGRAPHY."

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the size of the MEMS devices, thereby resulting in die size reduction.

SUMMARY

Provided herein is a method including fusion bonding a handle wafer to a first side of a device wafer. Standoffs are formed on a second side of the device wafer. A first hardmask is deposited on the second side. A second hardmask is deposited on the first hardmask. A surface of the second hardmask is planarized. A photoresist is deposited on the second hardmask, wherein the photoresist includes a MEMS device pattern. The MEMS device pattern is etched into the second hardmask. The MEMS device pattern is etched into the first hardmask, wherein the etching stops before reaching the device wafer. The photoresist and the second hardmask are removed. The MEMS device pattern is further etched into the first hardmask, wherein the further etching reaches the device wafer. The MEMS device pattern is etched into the device wafer. The first hardmask is removed. These and other features and advantages will be apparent from a reading of the following detailed description.

BRIEF DESCRIPTION OF DRAWINGS

FIGS. 19A and 19B show an exemplary flow diagram for actuator layer patterning with topography according to one aspect of the present embodiments.

FIG. 20 shows another exemplary flow diagram for actuator layer patterning with topography according to one aspect of the present embodiments.

FIGS. 21A and 21B show a further exemplary flow diagram for actuator layer patterning with topography according to one aspect of the present embodiments.

DESCRIPTION

Figure 1:
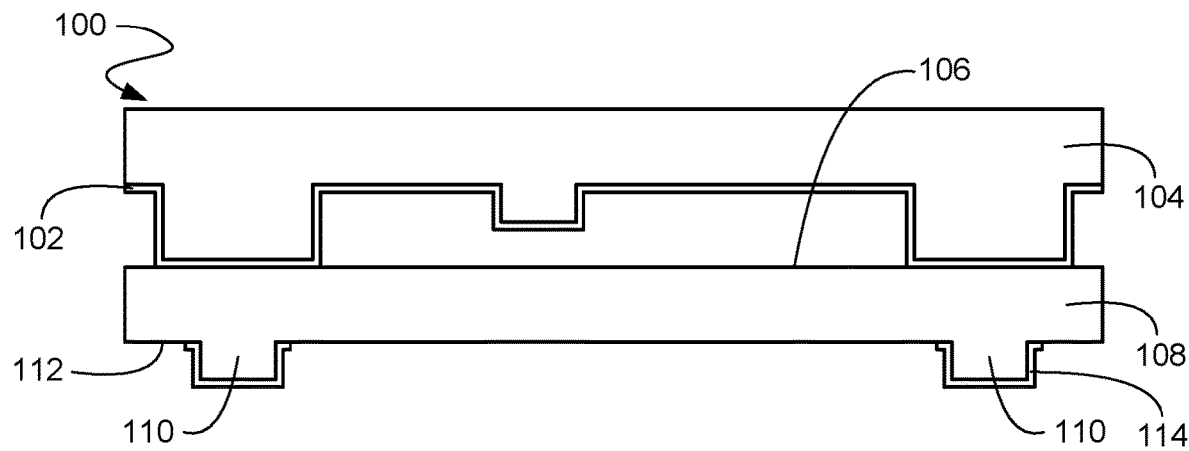
FIG. 1 shows a MEMS wafer at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

The existence of standoffs in MEMS sensors causes non-uniform thicknesses of photoresist, leading to lithography variations. Previous solutions have focused on increasing the distance between standoffs and key MEMS features, however these solutions increase the die size. Other solutions have focused on reducing the standoff height, however these solutions have used larger standoffs on the bond pair, thereby increasing the processing complexity of corresponding complementary metal-oxide semiconductor ("CMOS") wafers.

Accordingly, embodiments described herein utilize a hard mask coated on the MEMS surface during fabrication in order to reduce the distance between standoffs and key MEMS features. In various embodiments, the hard mask is used to create a planar topography in order to reduce or prevent photoresist buildup around the standoffs. Therefore, etch processes form MEMS features much closer to the standoffs, thereby achieving size reductions and maintaining performance.

Referring now to FIG. 1, a MEMS wafer 100 at an early stage of manufacture is shown according to one aspect of the present embodiments. A fusion bond oxide 102 fusion bonds a handle silicon wafer 104 to a first side 106 of a device silicon wafer 108. Standoffs 110 have been formed on a second side 112 of the device silicon wafer 108. A eutectic bond metal 114 (e.g. germanium, aluminum, etc.) has been deposited (e.g. sputtered) onto the second side 112 of the device silicon wafer 108 and etched. The etching removes the eutectic bond metal 114 from the second side 112 of the device silicon wafer 108, leaving the eutectic bond metal 114 covering the standoffs 110.

Figure 2:
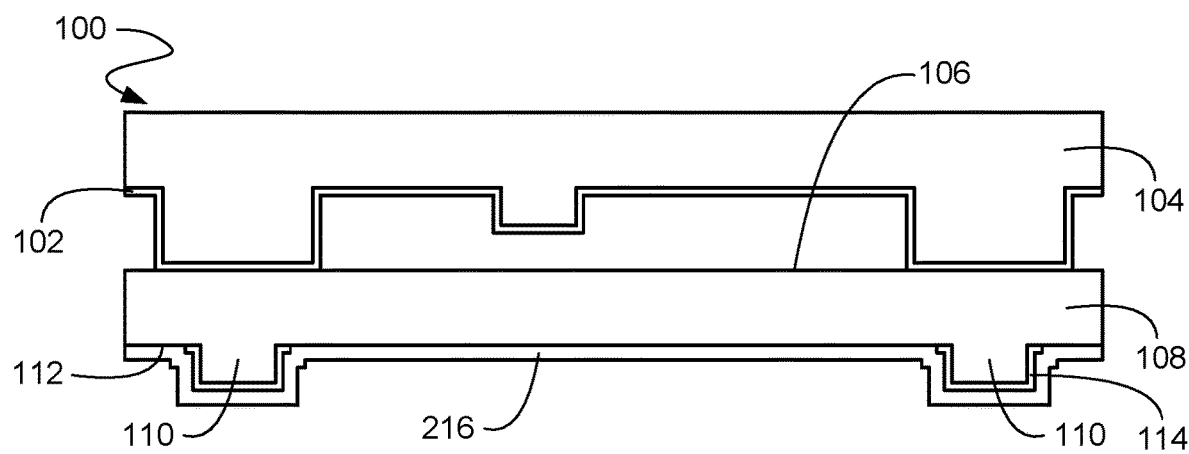
FIG. 2 shows the MEMS wafer after first hardmask deposition according to one aspect of the present embodiments.

Referring now to FIG. 2, the MEMS wafer 100 after first hardmask deposition is shown according to one aspect of the present embodiments. A first hardmask 216 is deposited on the second side 112 of the device silicon wafer 108 and the eutectic bond metal 114 covering the standoffs 110. In the illustrated embodiment, the first hardmask 216 conforms to the shape of the second side 112 of the device silicon wafer 108, including shape of the standoffs 110. In various embodiments the first hardmask 216 includes oxide and is a different material than the device silicon wafer 108.

Figure 3:
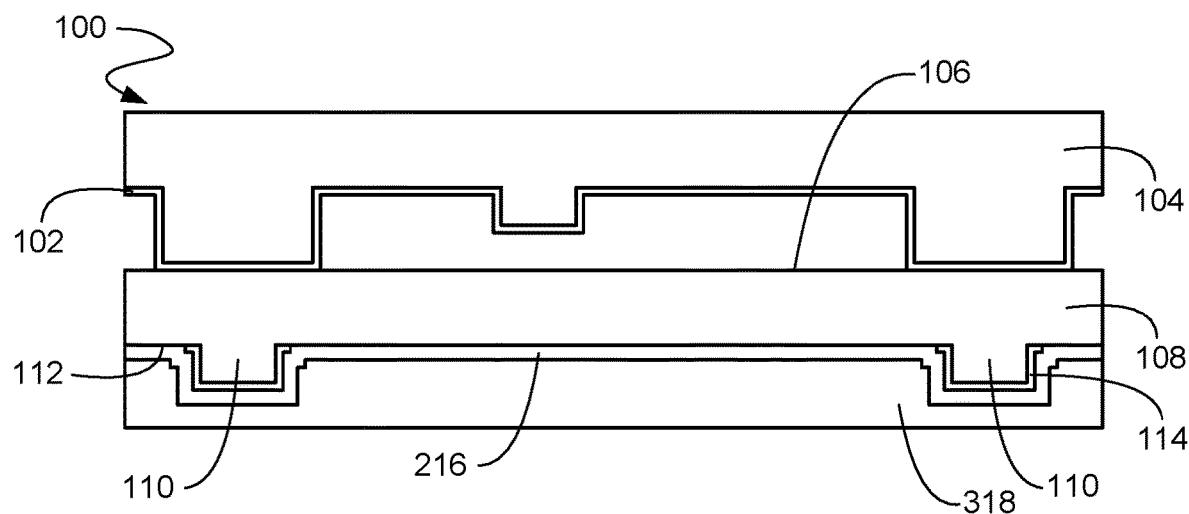
FIG. 3 shows the MEMS wafer after second hardmask deposition according to one aspect of the present embodiments.

Referring now to FIG. 3, the MEMS wafer 100 after second hardmask deposition is shown according to one aspect of the present embodiments. A second hardmask 318 is deposited over the first hardmask 216. In various embodiments, the second hardmask 318 is in overlying contact with the first hardmask 216. As such, the second hardmask 318 is deposited on a non-planar surface of the first hardmask 216, and the second hardmask 318 is thicker than the standoffs 110 and the eutectic bond metal 114. After deposition, the second hardmask 318 is planarized (e.g. chemical-mechanical polishing of the surface of the second hardmask 318), thereby forming a planar surface. In various embodiments the second hardmask 318 includes silicon, poly-silicon, amorphous silicon, or carbon. Therefore, in various embodiments the first hardmask 216 is different than the second hardmask 318.

Figure 4:
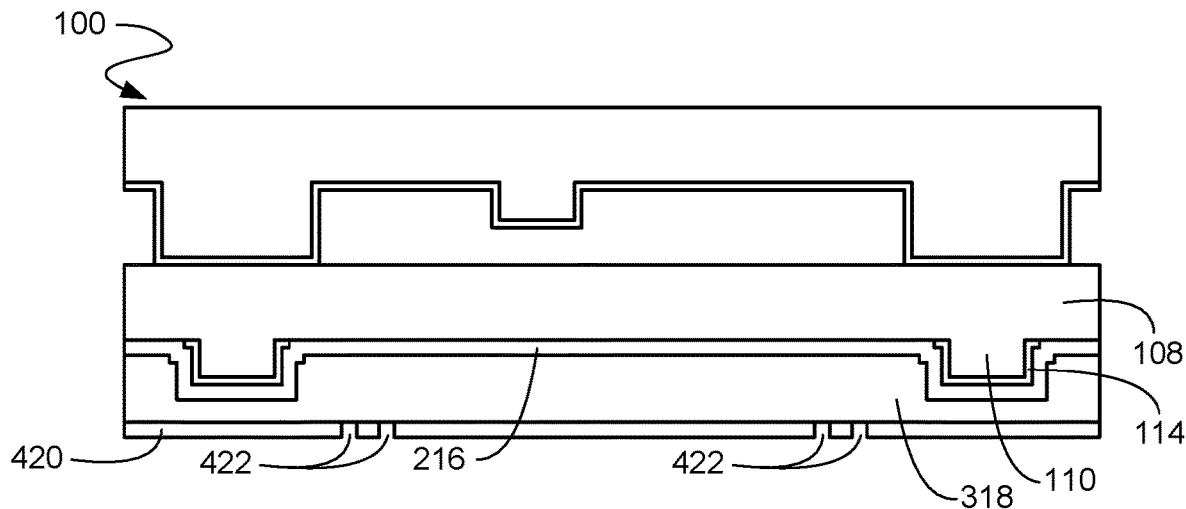
FIG. 4 shows the MEMS wafer after photoresist deposition according to one aspect of the present embodiments.

Referring now to FIG. 4, the MEMS wafer 100 after photoresist deposition is shown according to one aspect of the present embodiments. A photoresist 420 is deposited on the planar surface of the second hardmask 318. The photoresist includes a MEMS device pattern 422.

Figure 5:
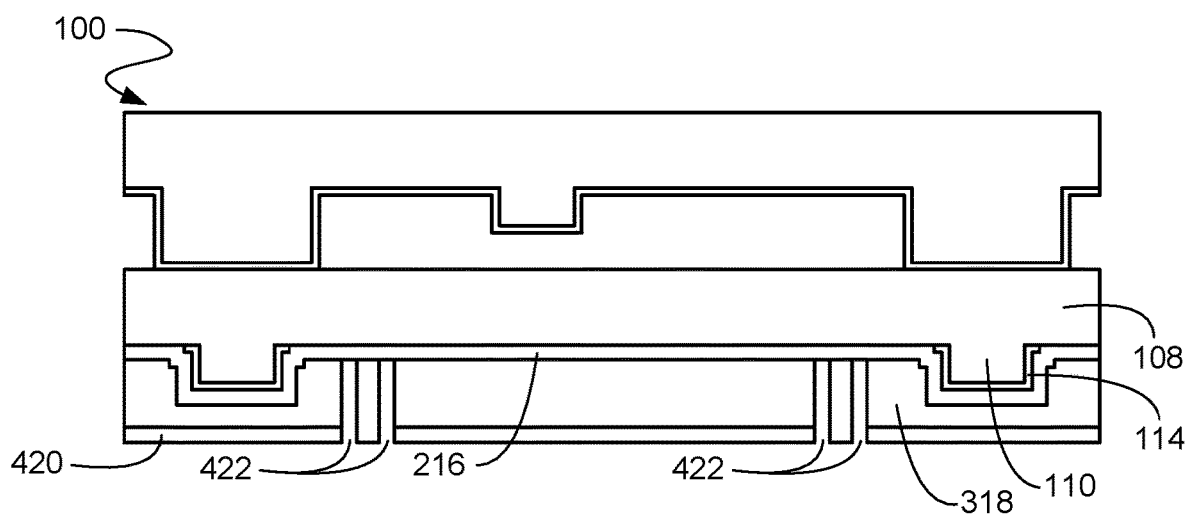
FIG. 5 shows the MEMS wafer after etching of the second hardmask according to one aspect of the present embodiments.

Referring now to FIG. 5, the MEMS wafer 100 after etching of the second hardmask 318 is shown according to one aspect of the present embodiments. The MEMS device pattern 422 is etched into the second hardmask 318 using the photoresist 420 as a mask. In various embodiments, the MEMS device pattern 422 is etched all the way through the second hardmask 318, stopping at the first hardmask 216.

Figure 6:
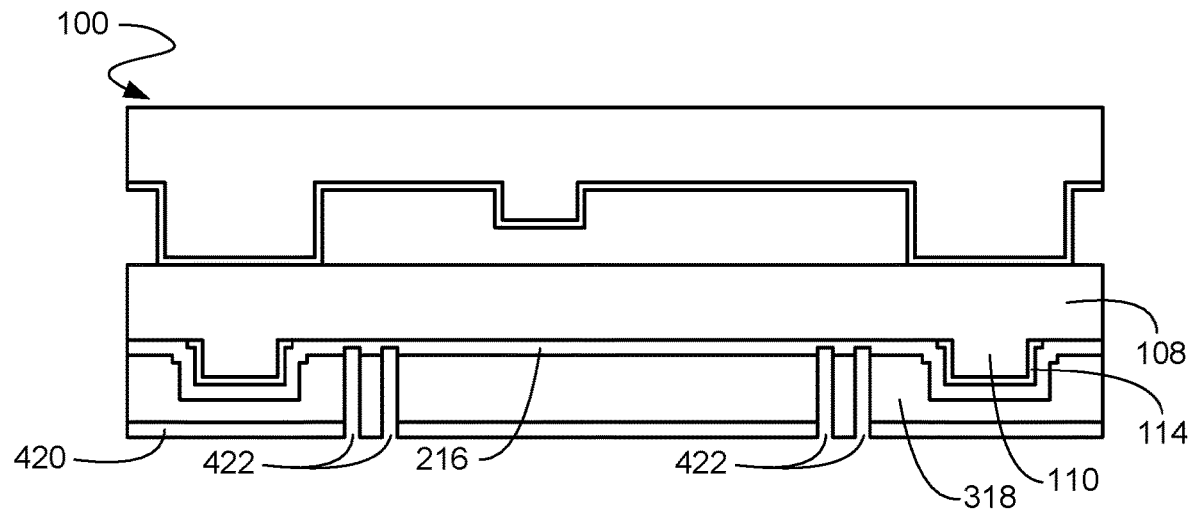
FIG. 6 shows the MEMS wafer after partially etching the first hardmask according to one aspect of the present embodiments.

Referring now to FIG. 6, the MEMS wafer 100 after partially etching the first hardmask 216 is shown according to one aspect of the present embodiments. The MEMS device pattern 422 is partially etched into the first hardmask 216 using the photoresist 420 as a mask. In various embodiments, the etching of the MEMS device pattern 422 stops partially through the first hardmask 216. As such, the etching stops before reaching the device silicon wafer 108.

In some embodiments (not shown), the MEMS device pattern 422 is etched all the way through the first hardmask 216 and partially into the device silicon wafer 108, exposing portions of the device silicon wafer 108. In such embodiments, the photoresist 420 is then removed, the MEMS device pattern 422 is further etched into the device silicon wafer 108 and the second hardmask is removed, and thereafter the first hardmask 216 is removed. The process then continues with FIG. 10.

Figure 7:
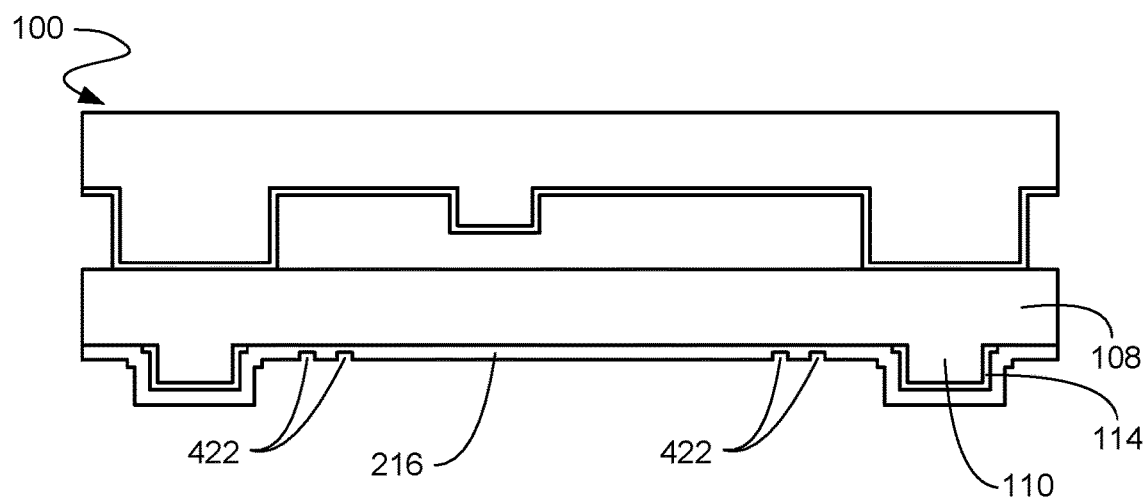
FIG. 7 shows the MEMS wafer after removal of the photoresist and the second hardmask according to one aspect of the present embodiments.

Referring now to FIG. 7, the MEMS wafer 100 after removal of the photoresist 420 and the second hardmask 318 is shown according to one aspect of the present embodiments. The photoresist 420 is removed (e.g. stripped) from the second hardmask 318. In addition, the second hardmask 318 is removed (for example, with an isotropic etch) from the first hardmask 216. As a result of the partial etch of the MEMS device pattern 422 into the first hardmask 216 (see previous steps), the remaining portions of the first hardmask 216 in the MEMS device pattern 422 protect the device silicon wafer 108 during removal of the second hardmask 318 and the photoresist 420.

Figure 8:
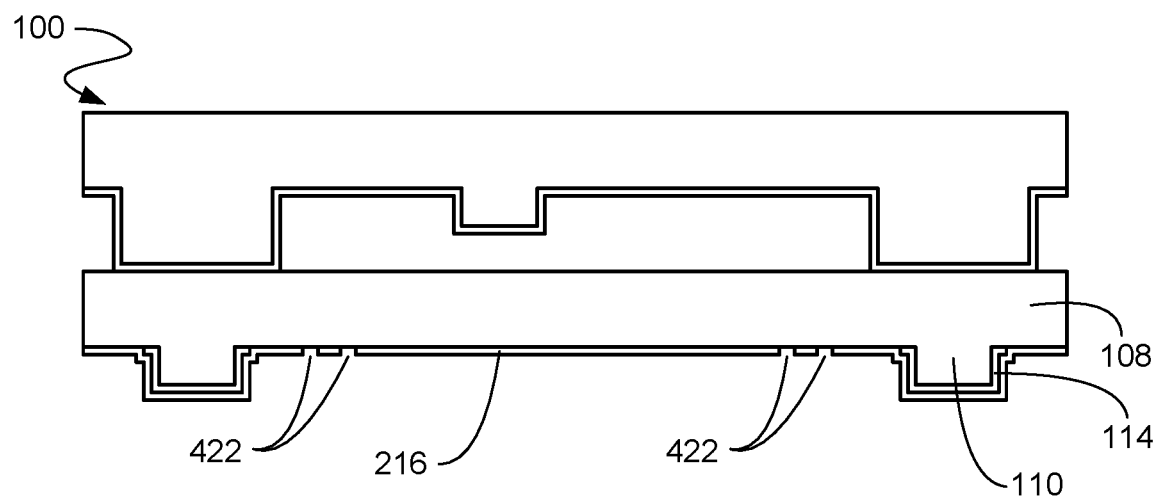
FIG. 8 shows the MEMS wafer after further etching of the first hardmask according to one aspect of the present embodiments.

Referring now to FIG. 8, the MEMS wafer 100 after further etching of the first hardmask 216 is shown according to one aspect of the present embodiments. The MEMS device pattern 422 is further etched into the first hardmask 216, wherein the etching reaches the device silicon wafer 108. In various embodiments, the further etching of the first hardmask 216 is a blanket etch of the first hardmask 216 to access the device silicon wafer 108.

Figure 9:
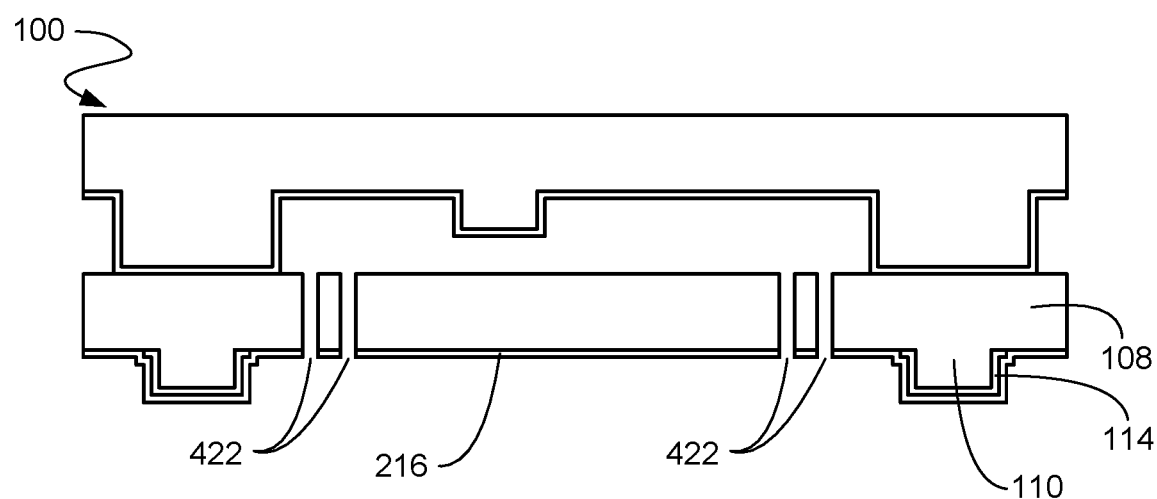
FIG. 9 shows the MEMS wafer after etching of the device silicon wafer according to one aspect of the present embodiments.

Referring now to FIG. 9, the MEMS wafer 100 after etching of the device silicon wafer 108 is shown according to one aspect of the present embodiments. The MEMS device pattern 422 in the first hardmask 216 is etched into the device silicon wafer 108.

Figure 10:
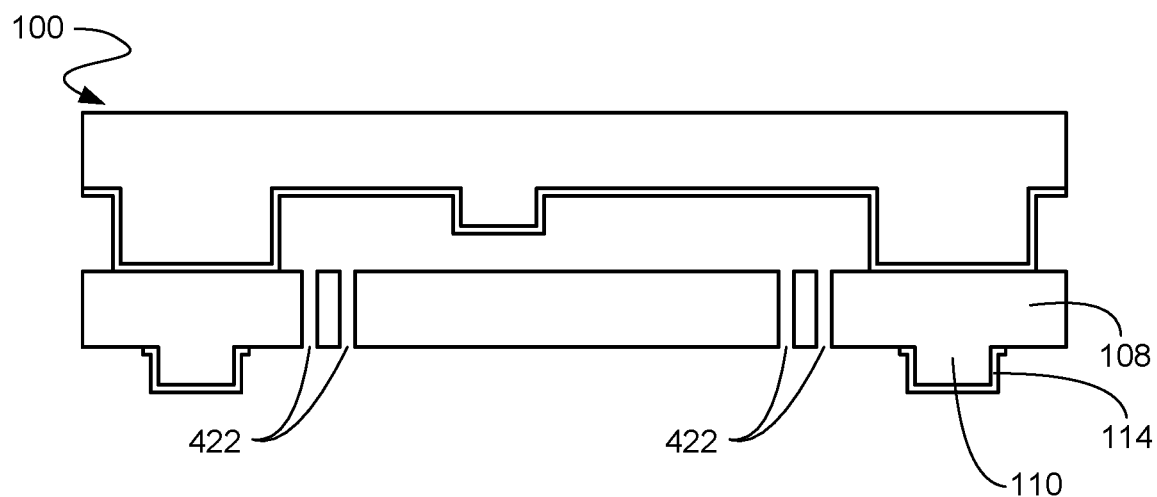
FIG. 10 shows the MEMS wafer after removal of the first hardmask according to one aspect of the present embodiments.

Referring now to FIG. 10, the MEMS wafer 100 after removal of the first hardmask 216 is shown according to one aspect of the present embodiments. The first hardmask 216 is removed (e.g. etched) from the device silicon wafer 108 and the eutectic bond metal 114 on the standoffs 110.

Figure 11:
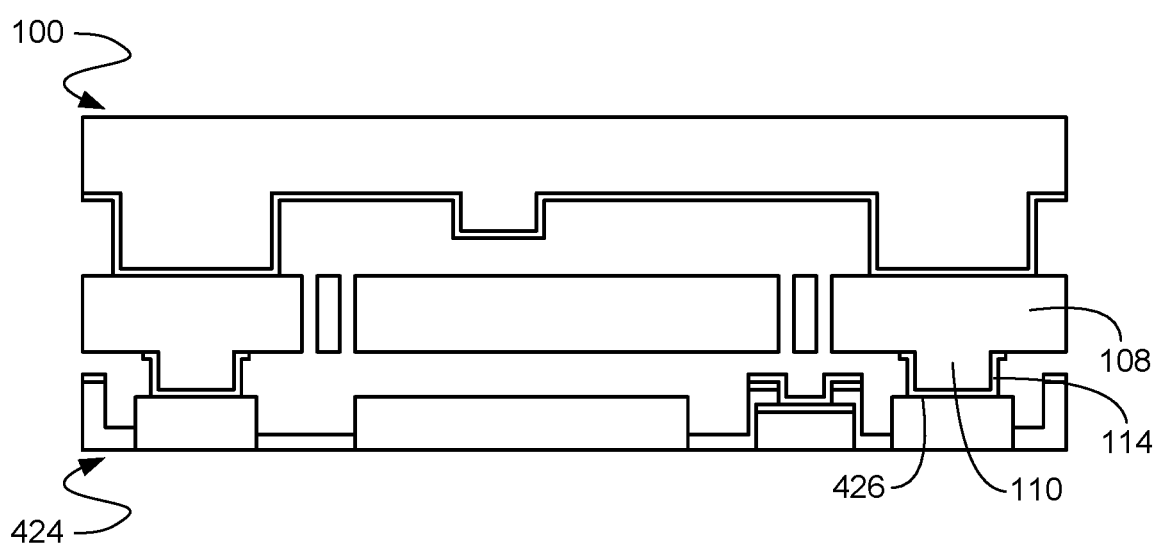
FIG. 11 shows the MEMS wafer after eutectic bonding to a CMOS wafer according to one aspect of the present embodiments.

Referring now to FIG. 11, the MEMS wafer 100 after eutectic bonding to a CMOS wafer is shown according to one aspect of the present embodiments. The standoffs 110 of the MEMS wafer 100 are eutecticly bonded to a CMOS wafer 424 with eutectic bonds 426. In various embodiments, the eutectic bond metal 114 (e.g. germanium) on the standoffs 110 may form the eutectic bonds 426 with another eutectic bond metal (e.g. aluminum) on the CMOS wafer 424.

The preceding figures describe embodiments wherein two hardmasks are used (e.g. first hardmask 216 and second hardmask 318. The following figures describe embodiments wherein only one hardmask is used.

Figure 12:
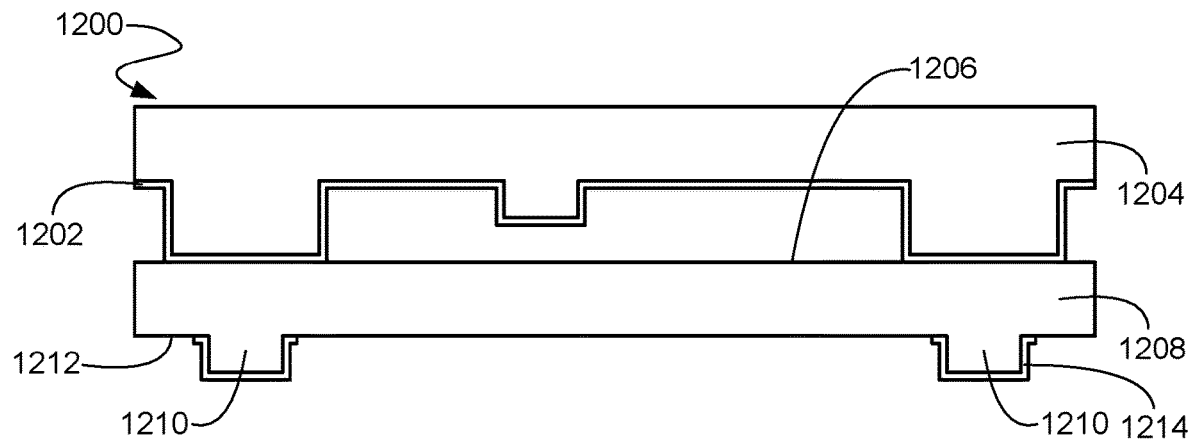
FIG. 12 shows another MEMS wafer at an early stage of manufacture according to one aspect of the present embodiments.

Referring now to FIG. 12, another MEMS wafer 1200 at an early stage of manufacture is shown according to one aspect of the present embodiments. A fusion bond oxide 1202 fusion bonds a handle silicon wafer 1204 to a first side 1206 of a device silicon wafer 1208. Standoffs 1210 have been formed on a second side 1212 of the device silicon wafer 1208. A eutectic bond metal 1214 (e.g. germanium, aluminum, etc.) has been deposited (e.g. sputtered) onto the second side 1212 of the device silicon wafer 1208 and etched. The etching removes the eutectic bond metal 1214 from the second side 1212 of the device silicon wafer 1208, leaving the eutectic bond metal 1214 covering the standoffs 1210.

Figure 13:
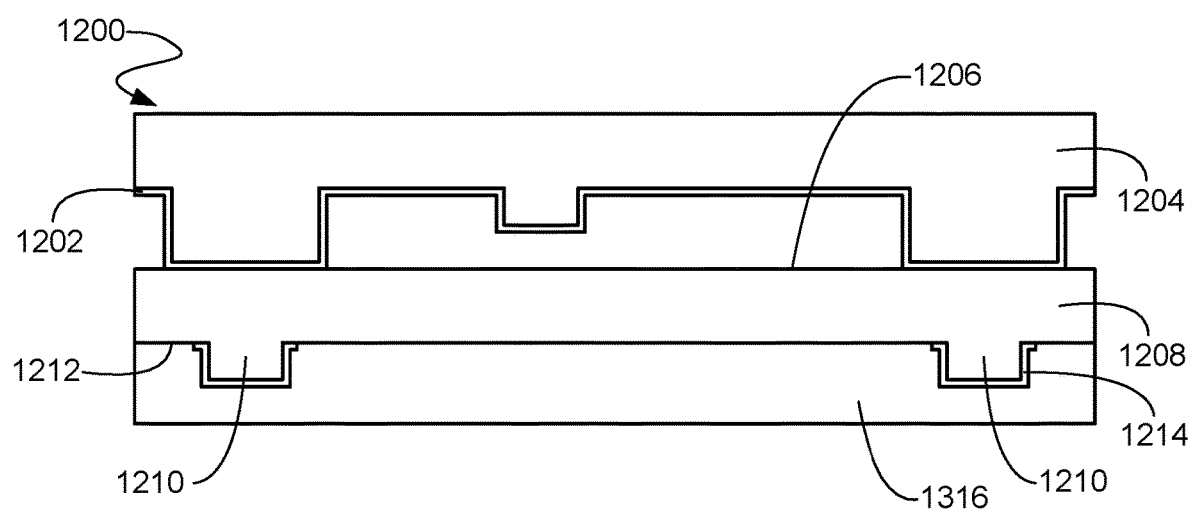
FIG. 13 shows the MEMS wafer after hardmask deposition according to one aspect of the present embodiments.

Referring now to FIG. 13, the MEMS wafer 1200 after hardmask deposition is shown according to one aspect of the present embodiments. A hardmask 1316 is deposited on the second side 1212 of the device silicon wafer 1208 and the eutectic bond metal 1214 covering the standoffs 1210. In the illustrated embodiment, the hardmask 1316 conforms to the shape of the second side 1212 of the device silicon wafer 1208, including shape of the standoffs 1210. As such, the hardmask 1316 is deposited on a non-planar surface of the device silicon wafer 1208, and the hardmask 1316 is thicker than the standoffs 1210 and the eutectic bond metal 1214. After deposition, the hardmask 1316 is planarized (e.g. chemical-mechanical polishing of the surface of the second hardmask 1316), thereby forming a planar surface. In various embodiments the hardmask 1316 includes oxide or carbon and is a different material than the device silicon wafer 1208.

Figure 14:
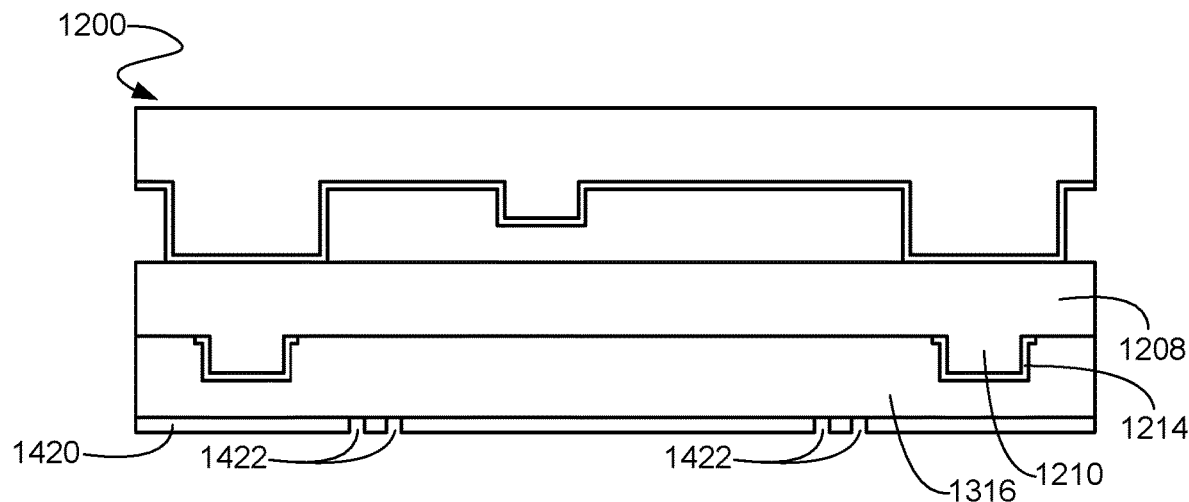
FIG. 14 shows the MEMS wafer after photoresist deposition according to one aspect of the present embodiments.

Referring now to FIG. 14, the MEMS wafer 1200 after photoresist deposition is shown according to one aspect of the present embodiments. A photoresist 1420 is deposited on the planar surface of the hardmask 1316. The photoresist includes a MEMS device pattern 1422.

Figure 15:
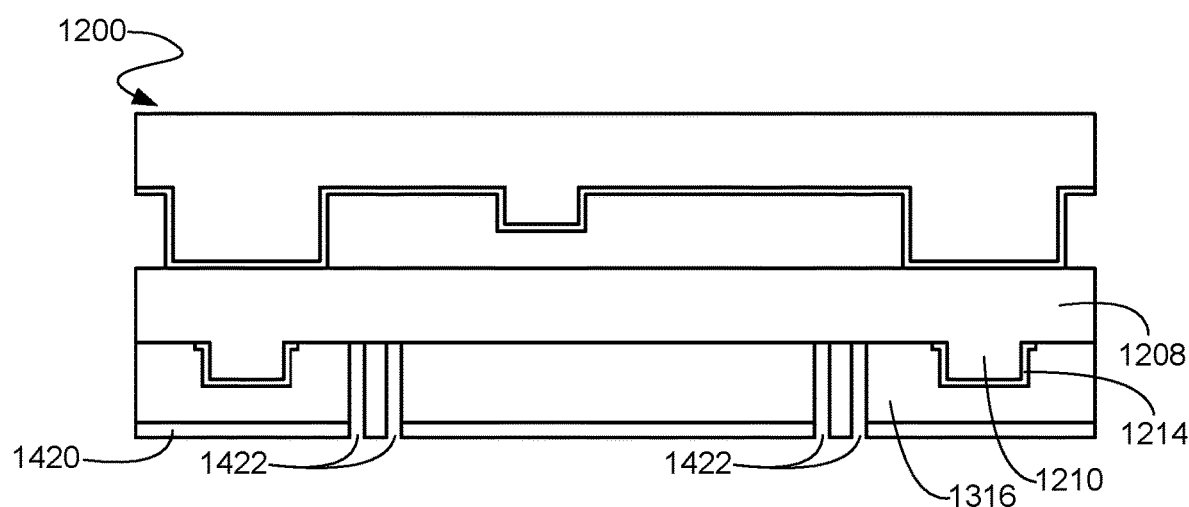
FIG. 15 shows the MEMS wafer after etching of the hardmask according to one aspect of the present embodiments.

Referring now to FIG. 15, the MEMS wafer 1200 after etching of the hardmask 1316 is shown according to one aspect of the present embodiments. The MEMS device pattern 1422 is etched into the hardmask 1316 using the photoresist 1420 as a mask. In various embodiments, the MEMS device pattern 1422 is etched all the way through the hardmask 1316, stopping at the device silicon wafer 1208.

Figure 16:
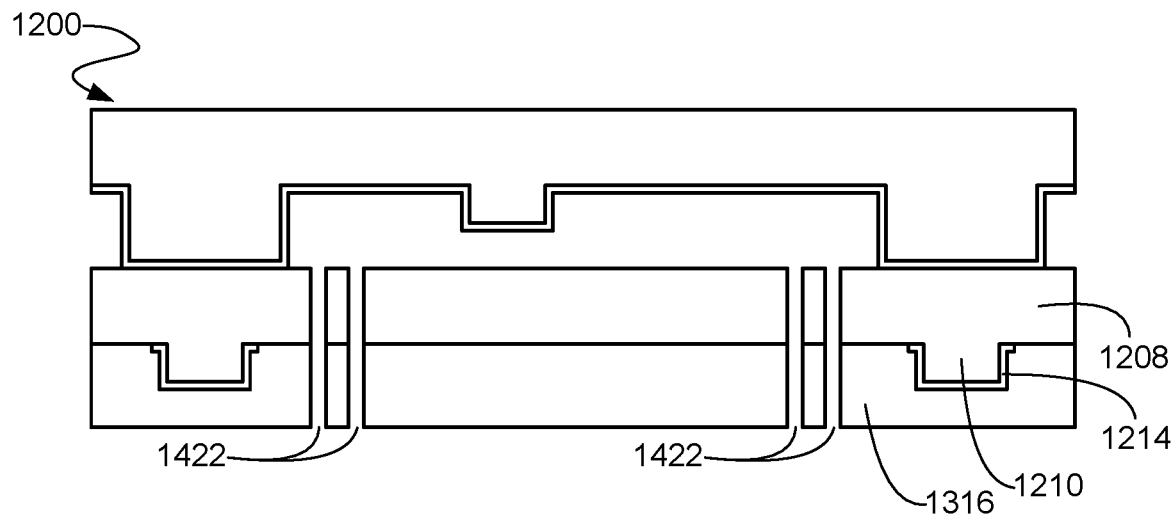
FIG. 16 shows the MEMS wafer after removal of the photoresist and etching of the device silicon wafer according to one aspect of the present embodiments.

Referring now to FIG. 16, the MEMS wafer 1200 after removal of the photoresist 1420 and etching of the device silicon wafer 1208 is shown according to one aspect of the present embodiments. The photoresist 1420 is removed (e.g. stripped) from the hardmask 1316. The MEMS device pattern 1422 in the hardmask 1316 is etched into the device silicon wafer 1208.

Figure 17:
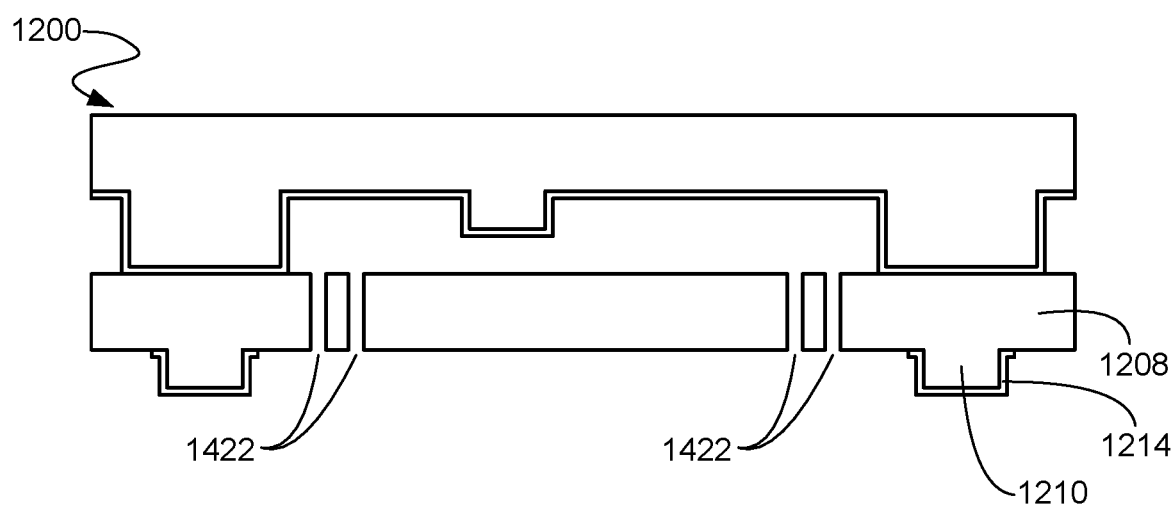
FIG. 17 shows the MEMS wafer after removal of the hardmask according to one aspect of the present embodiments.

Referring now to FIG. 17, the MEMS wafer 1200 after removal of the hardmask 1316 is shown according to one aspect of the present embodiments. The hardmask 1316 is removed (e.g. etched) from the device silicon wafer 1208 and the eutectic bond metal 1214 on the standoffs 1210.

Figure 18:
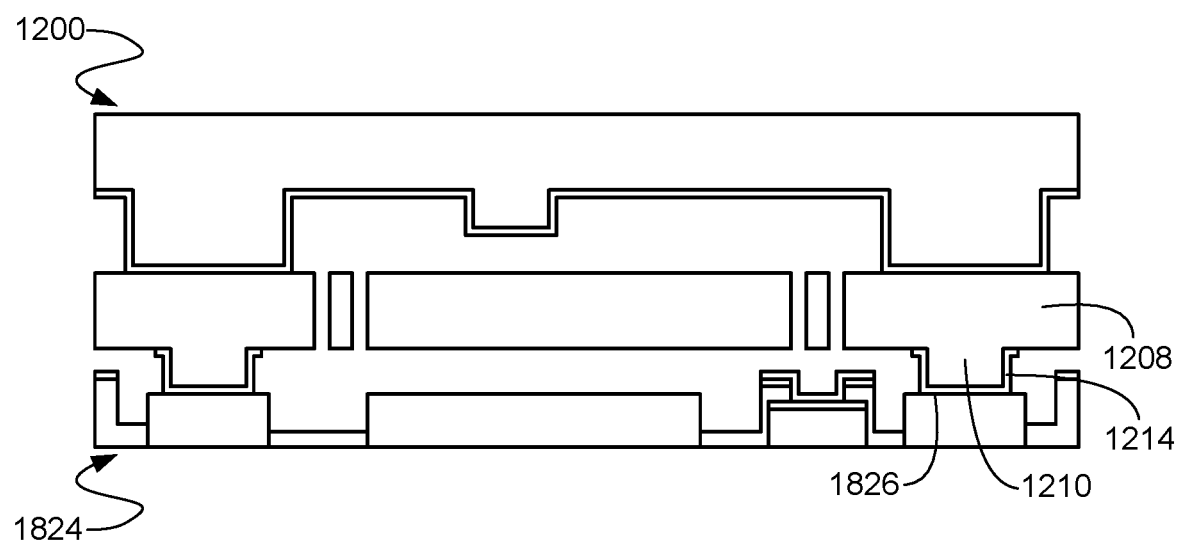
FIG. 18 shows the MEMS wafer after eutectic bonding to a CMOS wafer according to one aspect of the present embodiments.

Referring now to FIG. 18, the MEMS wafer 1200 after eutectic bonding to a CMOS wafer is shown according to one aspect of the present embodiments. The standoffs 1210 of the MEMS wafer 1200 are eutecticly bonded to a CMOS wafer 1824 with eutectic bonds 1826. In various embodiments, the eutectic bond metal 1214 (e.g. germanium) on the standoffs 1210 may form the eutectic bonds 1826 with another eutectic bond metal (e.g. aluminum) on the CMOS wafer 1824.

FIGS. 19A and 19B show an exemplary flow diagram for actuator layer patterning with topography according to one aspect of the present embodiments. At block 1902, a handle wafer is fusion bonded to a first side of a device wafer. At a block 1904, standoffs are formed on a second side of the device wafer. At a block 1906, a first hardmask is deposited on the second side. At a block 1908 a second hardmask is deposited on the first hardmask. At a block 1910, a surface of the second hardmask is planarized. At a block 1912, a photoresist is deposited on the second hardmask, wherein the photoresist includes a MEMS device pattern. At a block 1914, the MEMS device pattern is etched into the second hardmask. At a block 1916, the MEMS device pattern is etched into the first hardmask, wherein the etching stops before reaching the device wafer. At a block 1918, the photoresist and the second hardmask are removed. At a block 1920, the MEMS device pattern is further etched into the first hardmask, wherein the further etching reaches the device wafer. At a block 1922, the MEMS device pattern is etched into the device wafer. At a block 1924, the first hardmask is removed.

FIG. 20 shows another exemplary flow diagram for actuator layer patterning with topography according to one aspect of the present embodiments. At block 2002, a handle wafer is fusion bonded to a first side of a device wafer. At a block 2004, standoffs are formed on a second side of the device wafer. At a block 2006, a hardmask is deposited on the second side. At a block 2008, a surface of the hardmask is planarized. At a block 2010, a photoresist is deposited on the hardmask, wherein the photoresist includes a MEMS device pattern. At a block 2012, the MEMS device pattern is etched into the hardmask. At a block 2014, the photoresist is removed. At a block 2016, the MEMS device pattern is etched into the device wafer. At a block 2018, the hardmask is removed.

FIGS. 21A and 21B show a further exemplary flow diagram for actuator layer patterning with topography according to one aspect of the present embodiments. At block 2102, a handle wafer is fusion bonded to a first side of a device wafer. At a block 2104, standoffs are formed on a second side of the device wafer. At a block 2106, a first hardmask is deposited on the second side. At a block 2108, a second hardmask is deposited on the first hardmask. At a block 2110, a surface of the second hardmask is planarized. At a block 2112, a photoresist is deposited on the second hardmask, wherein the photoresist includes a MEMS device pattern. At a block 2114, the MEMS device pattern is etched into the second hardmask. At a block 2116, the MEMS device pattern is etched into the first hardmask and partially into the device wafer exposing portions of the device wafer. At a block 2118, the photoresist is removed. At a block 2120, the MEMS device pattern is further etched into the device wafer and the second hardmask is removed. At a block 2122, the first hardmask is removed.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
    fusion bonding a handle wafer to a first side of a device wafer;
    forming standoffs on a second side of the device wafer;
    depositing a first hardmask on the second side;
    depositing a second hardmask on the first hardmask;
    planarizing a surface of the second hardmask;
    depositing a photoresist on the second hardmask, wherein the photoresist includes a micro-electro-mechanical system ("MEMS") device pattern;
    etching the MEMS device pattern into the second hardmask;
    etching the MEMS device pattern into the first hardmask, wherein the etching stops before reaching the device wafer;
    removing the photoresist and the second hardmask;
    further etching the MEMS device pattern into the first hardmask, wherein the further etching reaches the device wafer;
    etching the MEMS device pattern into the device wafer; and
    removing the first hardmask.

2. The method of claim 1, further comprising depositing a eutectic bond metal on the standoffs.

3. The method of claim 2, further comprising depositing the first hardmask on the eutectic bond metal.

4. The method of claim 1, further comprising eutecticly bonding the standoffs to a complementary metal-oxide semiconductor ("CMOS") wafer.

5. The method of claim 1, wherein the first hardmask is different than the second hardmask.

6. The method of claim 1, wherein the first hardmask includes oxide.

7. The method of claim 1, wherein the second hardmask includes silicon, poly-silicon, amorphous silicon, or carbon.

8. The method of claim 1, wherein the second hardmask is deposited on a non-planar surface of the first hardmask.

9. The method of claim 1, wherein the second hardmask is removed with an etch.

10. The method of claim 1, wherein planarizing the surface of the second hardmask includes chemical-mechanical polishing the surface of the second hardmask.

11. A method comprising:
    fusion bonding a handle wafer to a first side of a device wafer;
    forming standoffs on a second side of the device wafer;
    depositing a hardmask on the second side;
    planarizing a surface of the hardmask;
    depositing a photoresist on the hardmask, wherein the photoresist includes a micro-electro-mechanical system ("MEMS") device pattern;
    etching the MEMS device pattern into the hardmask;
    removing the photoresist;
    etching the MEMS device pattern into the device wafer; and
    removing the hardmask.

12. The method of claim 11, further comprising depositing a eutectic bond metal on the standoffs.

13. The method of claim 12, further comprising depositing the hardmask on the eutectic bond metal.

14. The method of claim 12, wherein the eutectic bond metal is germanium.

15. The method of claim 11, further comprising eutecticly bonding the standoffs to a complementary metal-oxide semiconductor ("CMOS") wafer.

16. The method of claim 11, wherein the hardmask includes different material than the device wafer.

17. The method of claim 11, wherein the hardmask includes oxide or carbon.

18. The method of claim 11, wherein the hardmask is removed with an etch.

19. The method of claim 11, wherein planarizing the surface of the hardmask includes chemical-mechanical polishing the surface of the hardmask.

20. A method comprising:
    fusion bonding a handle wafer to a first side of a device wafer;
    forming standoffs on a second side of the device wafer;
    depositing a first hardmask on the second side;
    depositing a second hardmask on the first hardmask;
    planarizing a surface of the second hardmask;
    depositing a photoresist on the second hardmask, wherein the photoresist includes a micro-electro-mechanical system ("MEMS") device pattern;
    etching the MEMS device pattern into the second hardmask;
    etching the MEMS device pattern into the first hardmask and partially into the device wafer exposing portions of the device wafer;
    removing the photoresist;
    further etching the MEMS device pattern into the device wafer and removing the second hardmask; and
    removing the first hardmask.

* * * * *